(12) United States Patent
Yang et al.

(10) Patent No.: US 8,512,667 B2
(45) Date of Patent: Aug. 20, 2013

(54) HIGH TEMPERATURE STABLE NANOCRYSTALLINE SIGE THERMOELECTRIC MATERIAL

(75) Inventors: Sherwin Yang, Chatsworth, CA (US); Daniel Edward Matejczyk, West Hills, CA (US); William Determan, Sylmar, CA (US)

(73) Assignee: Pratt & Whitney, Rocketdyne, Inc., Canoga Park, CA (US)

( * ) Notice: Subject to any disclaimer, the term of this patent is extended or adjusted under 35 U.S.C. 154(b) by 317 days.

(21) Appl. No.: 12/946,296

(22) Filed: Nov. 15, 2010

(65) Prior Publication Data

US 2012/0121495 A1 May 17, 2012

(51) Int. Cl.
*C01B 21/068* (2006.01)

(52) U.S. Cl.
USPC .......................................... 423/344; 423/351

(58) Field of Classification Search
USPC .................................................. 423/344, 351
See application file for complete search history.

(56) References Cited

U.S. PATENT DOCUMENTS

| | | | |
|---|---|---|---|
| 3,458,144 | A | 7/1969 | Lessells et al. |
| 5,246,505 | A | 9/1993 | Mowery, Jr. |
| 6,334,583 | B1 | 1/2002 | Li |
| 6,793,875 | B1 | 9/2004 | Shaw et al. |
| 2008/0202575 | A1 | 8/2008 | Ren et al. |
| 2012/0153240 | A1* | 6/2012 | Luo et al. ............. 252/519.4 |

OTHER PUBLICATIONS

Thiagarajan, et al. "Nanocomposites as high efficiency thermoelectric materials." Annual Review of Nano Research. vol. 3. Dec. 2009.
Ravi, et al. "Thermal expansion studies of selected high-temperature thermoelectric materials." Journal of Electronic Materials, vol. 38, No. 7, 2009.
Wang. "Thermoelectric-figure-of-merit enhancement of silicon-germanium through nanocomposite concept." Jan. 1, 2007. Boston College Dissertations and Theses. Paper AAI3301810. http://escholarship.bc.edu/dissertations/AAI3301810.
Caillat, et al. "Status of skutterudite-based segmented thermoelectric technology components development at JPL." 23rd Symposium on Space Nuclear Power and Propulsion STAIF 2006. Jet Propulsion Laboratory/California Institute of Technology.
Bennett, et al. "Mission of daring: the general-purpose heat source radioisotope thermoelectric generator." 4th International Energy Conversion Engineering Conference and Exhibit. Jun. 26-29, 2006. San Diego, CA. American Institute of Aeronautics and Astonautics.
Caillat, et al. "Advanced high-temperature thermoelectric devices." DOE Thermoelectric Applications Workshop. San Diego, CA. Sep. 2009. Jet Propulsion Laboratory/California Institute of Technology.
Joshi, et al. "Enhanced thermoelectric figure-of-merit in nanostructured p-type silicon germanium bulk alloys." Nano Letters. ACS Publications. Retrieved May 27, 2010 from <http://pubs.acs.org/doi/abs/10.1021/n18026795. 2010 American Chemical Society.
Yang, et al. "Nanostructured thermoelectric materials: from superlattices to nanoconiposites." Materials Integration, Special Issue. vol. 18. 2005.

* cited by examiner

*Primary Examiner* — Edward Johnson
(74) *Attorney, Agent, or Firm* — Kinney & Lange, P.A.

(57) ABSTRACT

A method of forming a nanocomposite thermoelectric material having microstructural stability at temperatures greater than 1,000° C. The method includes creating nanocrystalline powder by cryomilling. The method is particularly useful in forming SiGe alloy powder.

12 Claims, 2 Drawing Sheets

HIGH TEMPERATURE STABLE NANOCRYSTALLINE SIGE THERMOELECTRIC MATERIAL

STATEMENT OF GOVERNMENT INTEREST

This invention was made with government support under Contract No. 1320783 awarded by NASA. The government has certain rights in the invention.

BACKGROUND

Thermoelectric devices are notable in that they have no moving parts. Solid state thermoelectrical conversion relies only on a temperature differential to generate a current or, conversely, an electrical current to generate a temperature differential, i.e. to heat or cool. Thermoelectric devices have been used extensively since the early 1960's as reliable power supplies for remote applications such as spacecraft for deep space exploration. Specific examples are radioisotope thermoelectric generators (RTG) which use radioisotopes as heat sources. Galileo, Cassini, and other spacecraft are powered by reliable RTG units.

Efficient thermoelectric materials are semiconductors such as silicon, germanium, silicon-germanium alloys, lead telluride, bismuth telluride, and bismuth selenide. The thermoelectric efficiency of power conversion is indicated by the dimensionless figure of merit ZT, which is given by the following equation:

$$ZT = \frac{S^2 \sigma T}{K}$$

where S, σ, K and T are the Seebeck coefficient, electrical conductivity, thermal conductivity and absolute temperature, respectively. Until recently, ZT values for all thermoelectric materials have been less than 1, thereby limiting their use to applications, such as space vehicles, where low conversion efficiency is tolerated due to the necessity for such specialized applications. One thermoelectric material of choice for RTG applications is silicon germanium alloys with a ZT between 0.5 and 0.8.

Recently, microstructural engineering has resulted in thermoelectric materials exhibiting ZT values approaching and even exceeding unity. One successful approach involves the creation of ultrafine (nano) powder composites of thermoelectric materials. It is postulated that the high density of physical interfaces (e.g. grain boundaries) in the nano composites acts to impede phonon propagation resulting in decreased thermal conductivity while maintaining electrical conductivity thereby enhancing $S^2$ and ZT, the thermoelectric figure of merit.

SUMMARY

Methods of forming a composite thermoelectric material with microstructural stability at elevated temperatures are disclosed. The methods include creating crystalline powders by cryomilling in a mixture of liquid nitrogen and nitrogen gas. High energy ball milling and attritor milling are suitable processing methods. The methods are particularly suitable for SiGe alloy thermoelectric materials used in radioisotope thermoelectric generators (RTGs).

DETAILED DESCRIPTION

The thermoelectric power supply currently in service on deep space exploration vehicles such as Cassini are radioisotope thermoelectric generators (RTG). RTGs use a heat source fueled by the decay of plutonium (238) oxide. The product of the decay is the emission of alpha particles, i.e. helium nuclei. At peak power, the source reaches about 1,000° C. Power is generated by a thermoelectric "unicouple" consisting of two SiGe thermoelectric alloy rods, each of which has one end in contact with a SiMo alloy "hot shoe" that is, in turn, connected to the heat source. The other ends of the thermoelectric rods are exposed to the cold conditions of outer space and are at an estimated temperature of about 300° C. The average power output of the RTG over a 40,000 hour lifetime is 275 watts.

Figure 1:
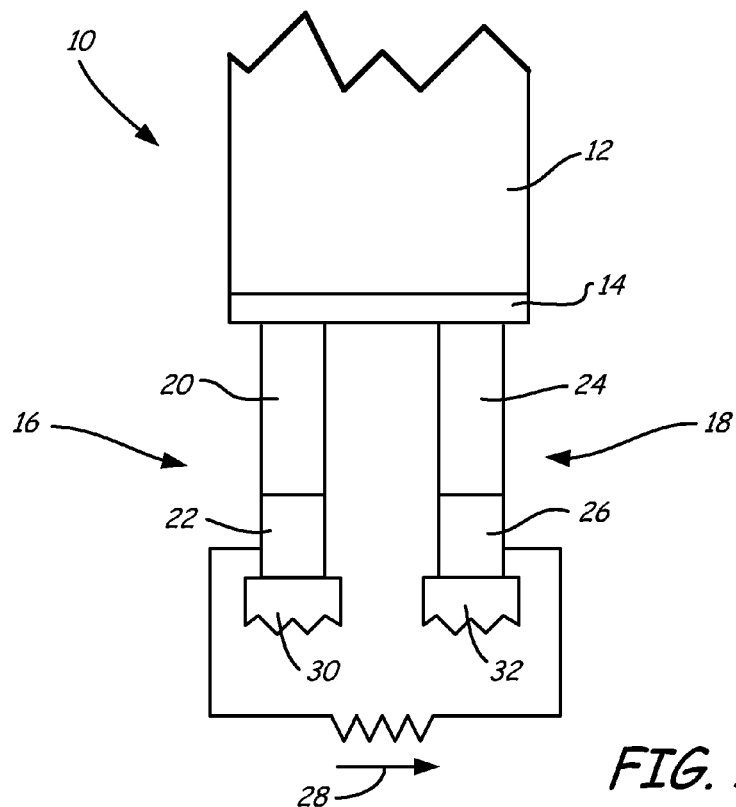
FIG. 1 is a schematic of a SiGe alloy unicouple.

A schematic of a SiGe unicouple is shown in FIG. 1. SiGe thermoelectric unicouple 10, comprises radioisotope heat source 12, SiMo alloy "hot shoe" 14, SiGe alloy rods 16 and 18 and heat sinks 30 and 32. SiGe alloy rod 16 is the p-type leg of the unicouple and may be comprised of boron-doped $Si_{0.78}Ge_{0.22}$ alloy segment 20 and boron-doped $Si_{0.63}Ge_{0.36}$ alloy segment 22. SiGe alloy rod 18 is the n-type leg of the unicouple and is comprised of phosphorus-doped $Si_{0.78}Ge_{0.22}$ alloy segment 24 and phosphorus-doped $Si_{0.63}Ge_{0.36}$ alloy segment 26. Radioisotope heat source 12 is thermally connected to hot shoe 14 which is maintained at a temperature of about 1000° C. by radioisotope heat source 12. Hot shoe 14 is thermally connected to SiGe alloy rods 16 and 18 which are, in turn, thermally connected to heat sinks 30 and 32 respectively. Heat sinks 30 and 32 are maintained at a temperature of about 300° C. The temperature differential between the hot and cold regions of unicouple 10 results in a thermoelectric current as indicated by arrow 28. In one embodiment of a thermoelectric power supply, there may be 572 unicouples in the RTG generating a specific power of about 5.7 watts per kilogram.

Figure 2:
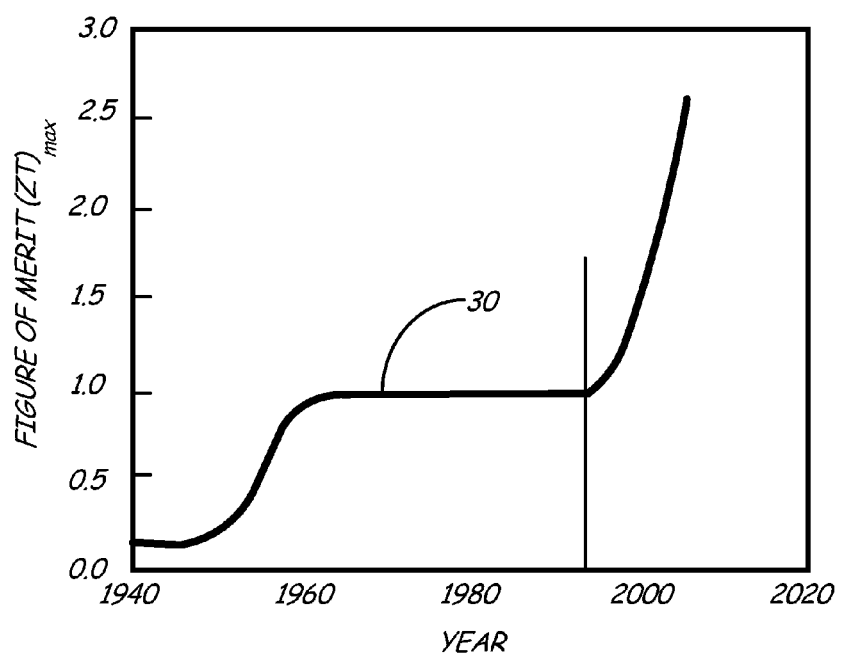
FIG. 2 is a curve showing the historical progress of thermoelectric material development.

Efforts to improve the efficiency (and ZT) of thermoelectric materials are ongoing. The historic progress of the development of high-efficiency thermoelectric materials is shown by curve 30 in FIG. 2. Thermoelectric efficiency reached a value of 1 around 1960 and remained constant until about 1993. It started to increase as the understanding of methods to decrease thermal conductivity K without changing electrical conductivity σ were theoretically developed and experimentally confirmed by material scientists in a large number of thermoelectric materials and material systems. It was shown that composite materials containing internal interfaces and second phase particles with dimensions less than 1 micron, preferably less than 0.1 micron, interacted strongly with phonons to impede phonon propagation and decrease thermal conductivity. It was also shown that electron propagation in these materials was hardly affected. This discovery resulted in the rapid development of thermoelectric materials and material systems with ZT greater than 1, as shown in FIG. 2. These materials and material systems in general are termed nanocomposites.

One type of material configuration that has been shown to increase the efficiency of thermoelectric materials is compacted powders.

Figure 3:
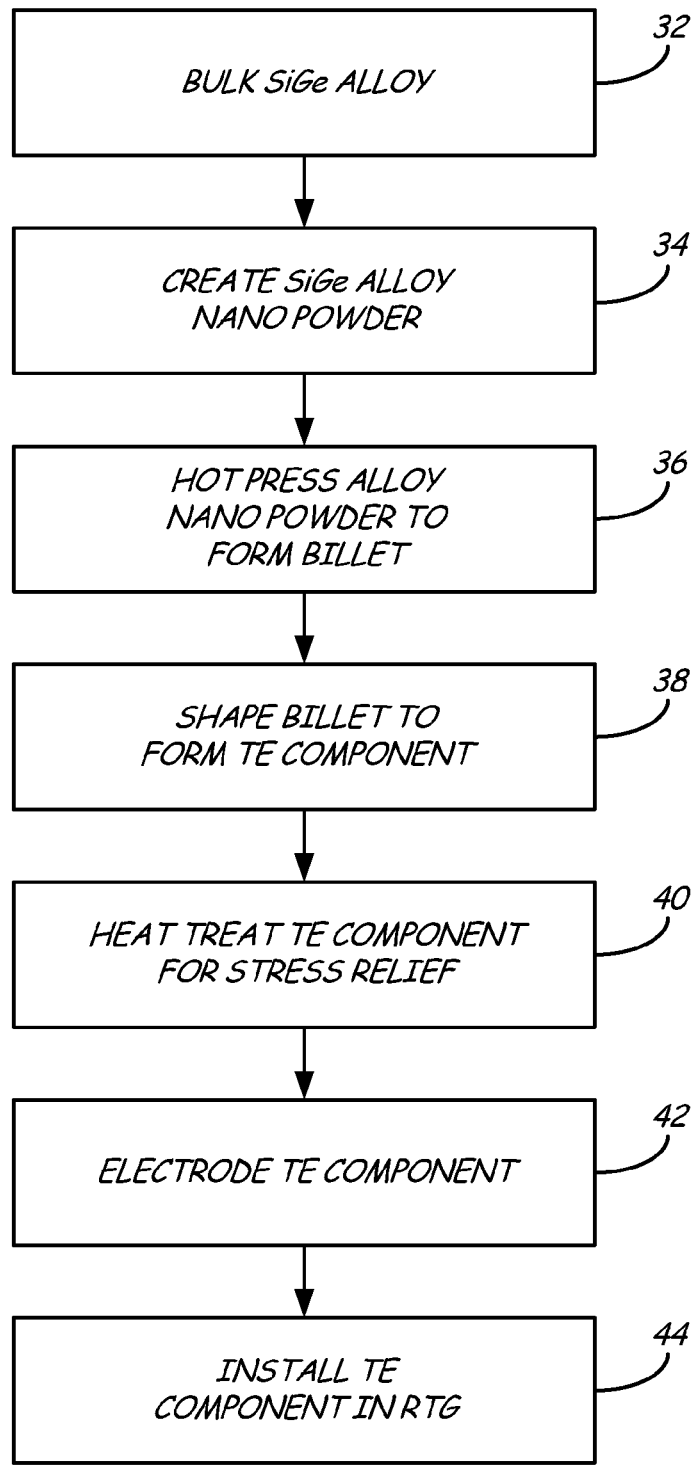
FIG. 3 is a chart of the process of creating and installing a thermoelectric component.

A process of creating SiGe alloy thermoelectric components for RTG application is shown in FIG. 3. After bulk SiGe alloy is produced (Step 32), the material is reduced to powder form with particle sizes less than 1 micron, preferably less than 0.1 micron (Step 34). The powder is then processed into billet form by hot pressing (Step 36), cooled and shaped into thermoelectric components (Step 38). The components are heat treated if necessary, to release internal stresses and increase chemical homogeneity (Step 40). Electrodes and other connections are then applied to prepare the component for installation (Step 42). Finally, the component is installed in RTGs for service (Step 44). It is suggested that the grain boundaries in the compacted nanocomposite material may impede phonon propagation at little expense of electron propagation. It is also suggested that thermoelectric efficiency may improve as the surface to volume ratio of the nanocomposite increases.

Common methods of producing powders with nanocrystalline dimension particle sizes such as high energy ball milling can lead to the entrapment of impurities in the hot pressed composites due to the large surface to volume ratio of fine powders. The impurities degrade thermoelectric efficiency. Improved thermoelectric nanocomposite processing methods are needed.

The first step in creating a fine powder is to coarsely grind the initial material. SiGe alloys are highly reactive in powder form and need to be processed in an inert environment. Argon gas is typically used in the art to protect the charge during grinding. A preferred grinding method of choice by those in the art to produce ultrafine (i.e. nano) SiGe powders is planetary ball milling, capable of producing SiGe batches up to 250 grams (Caillat, T., et. al, "Advanced High-Temperature Thermoelectric Devices, DOE Thermoelectric Workshop, San Diego, September 2009).

In one embodiment, SiGe alloy powders are produced by a high energy ball milling process. A high energy ball mill differs from a conventional ball mill in that the cylindrical drums containing the charge and the milling media rotate around two axes rather than one. The double rotation leads to increased charge/media contact and results in finer particle size. Li (U.S. Pat. No. 6,334,583) illustrates an example of a high energy ball mill.

In another embodiment, SiGe powders are produced in an attritor mill. A high energy attritor mill differs from a conventional ball mill in that the cylindrical drum containing the charge and milling media is vertical and stationary. A motor driven shaft with horizontal arms extending to the outer diameter of the drum is positioned at the central axis of the drum. The shaft is rotated at a fairly high speed which produces high tip velocities at the end of the agitator arms, thereby imparting a large amount of energy directly to the milling media. Particle size reduction is achieved by impact and shearing forces as the milling media collide with one another. A characteristic of attritor milling is minimum wear on the drum wall and rapid particle size reduction. Lessells et al. (U.S. Pat. No. 3,458,144) describe an attritor mill. Fritzemeier et al. (U.S. Pat. No. 6,902,699 and U.S. Pat. No. 7,354,490) describe the use of an attritor mill for milling aluminum alloy powder in liquid nitrogen. The operating parameters for milling will depend on the size of the attritor. For the case of milling of aluminum by Fritzemeier et al., the attritor is preferably operated at a speed of about 100 rpm.

Since SiGe alloys are chemically active and readily react with oxygen, powder formation must be carried out in an inert atmosphere. In one example in the art, SiGe powders are loaded in an argon-environment glove box, into cans along with balls for milling. The sealed cans are processed in a planetary ball mill, resulting in milling of the SiGe in an inert argon environment (refs: Caillat, T., et al., "Advanced Thermoelectric Materials for Radioisotope Thermoelectric Generators," 25$^{th}$ Symposium on Space Nuclear Power, Albuquerque, N. Mex., February, 2008; "Mechanical Alloying for Making Thermoelectric Compounds," NASA Tech Briefs, September 2007, pp. 31-32.). The entrapment of argon in the hot pressed nanocomposites leads to processing issues that limit the maximum operating temperature of the SiGe unicouples. It is suggested that the evolution of argon during exposure at 1,000° C. or higher and resulting porosity and surface contamination limits the electrode bonding temperature and resulting operating temperature. The operating lifetime at 1,000° C. or higher is also effected.

Ravi, et al. (Journal of Electronic Materials, Vol. 38, No. 7, 2009, pp. 1433-1442) showed permanent thermal expansion during thermal cycling of mechanically alloyed SiGe. During thermal expansion measurements, samples expanded anomalously during the first cycle of heating. Effects are evident at temperatures above 800° C. The severity of the anomalous expansion increases with increasing temperature around 800° C. Samples exposed in this manner exhibit porosity within the microstructure. It is believed this is due to combined effects of low creep strength and expansion of entrapped argon. This behavior creates difficulties during processing, in particular, thermal bonding. A preferred embodiment is to diffusion bond SiGe alloy rods 16 and 18, to hot shoe 14 at temperatures above 1000° C. Anomalous expansion and low creep strength create difficulties in fabricating repeatable interfacial bonds and in controlling component geometry at the loads and temperatures desired for diffusion bonding.

The inventive embodiment disclosed in this application is the elimination of argon in the milling process by cryomilling instead in liquid nitrogen and nitrogen gas. During cryomilling the powder charge and grinding media (e.g. balls) are submersed in liquid nitrogen in a closed container. Low temperature nitrogen processing prevents oxidation of nanocrystalline SiGe powder.

In an exemplary embodiment, the cryomilled powder is hot pressed at temperatures exceeding 1000° C. (Step 36). During high temperature consolidation of the powder, adsorbed nitrogen atoms will react with SiGe to form small amounts of $Si_xN_y$ particles in the nanocomposite. There will not be any free nitrogen to form free $N_2$ bubbles and cavities in the hot pressed billet. The amount of the $Si_xN_y$ can be controlled by varying the energy input, ball milling time, and temperature of the liquid nitrogen/nitrogen gas environment during high energy ball milling and attritor processing. A low volume of about 2 vol. % of $Si_xN_y$ dispersoids will result in significant strengthening of the nanocomposite while not affecting the thermoelectric performance. The thermoelectric properties of the SiGe matrix will not be significantly affected because the solubility of nitrogen in silicon is low, and therefore the principal effect of cryomilling in nitrogen will be to introduce the small volume fraction of relatively inert $Si_xN_y$ strengthening particles while leaving the matrix unchanged.

The hot pressed SiGe alloy composite may be annealed to relieve internal stress and increase chemical homogeneity. In an exemplary embodiment the composite component may be annealed at temperatures less than 1000° C., preferably 800° C.

Benefits of cryomilling SiGe alloys include (1) increased tensile and compressive strengths, (2) increased creep strength, (3) increased resistance to recrystallization and grain growth at high temperatures and, as discussed above, (4) improved processability at elevated temperatures including electrode and other bonding operations currently practiced in the art.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of forming a thermoelectric component comprising:
    creating a powder of thermoelectric material by cryomilling the thermoelectric material in a mixture of liquid nitrogen and nitrogen gas; and
    hot pressing the powder to form a thermoelectric component.

2. The method of claim 1 wherein the cryomilling is performed in a high energy ball mill with the balls and powder submersed in liquid nitrogen in a closed container.

3. The method of claim 1 wherein the cryomilling is performed in an attritor mill with the balls and powder submersed in liquid nitrogen in a closed container.

4. The method of claim 1 wherein the powder has a particle size less than 1 micron.

5. The method of claim 1 wherein the powder has a particle size less than 0.1 micron.

6. The method of claim 1 wherein the hot pressing is at a temperature greater than about 1,000° C.

7. The method of claim 1 and further comprising:
    annealing the thermoelectric component.

8. The method of claim 6 wherein the annealing is at a temperature less than about 1,000° C.

9. The method of claim 1 wherein the thermoelectric material is a SiGe alloy.

10. A method comprising:
    creating a powder of thermoelectric material by cryomilling the thermoelectric material in a mixture of liquid nitrogen and nitrogen gas; and
    hot pressing the powder to form a high temperature thermoelectric component with microstructural stability at temperatures exceeding 1,000° C.

11. The method of claim 10 and further comprising:
    annealing the thermoelectric component.

12. The method of claim 10 wherein the cryomilling is performed in a high energy ball mill or an attritor mill.

* * * * *